United States Patent [19]

Kukanskis et al.

[11] Patent Number: 4,608,275
[45] Date of Patent: Aug. 26, 1986

[54] OXIDIZING ACCELERATOR

[75] Inventors: Peter E. Kukanskis, Woodbury; John J. Grunwald, New Haven; David Sawoska, Waterbury, all of Conn.

[73] Assignee: MacDermid, Incorporated, Waterbury, Conn.

[21] Appl. No.: 712,981

[22] Filed: Mar. 18, 1985

Related U.S. Application Data

[63] Continuation-in-part of Ser. No. 510,333, Jul. 1, 1983, abandoned.

[51] Int. Cl.[4] ............................................. C23C 18/30
[52] U.S. Cl. .................................. 427/98; 427/304; 427/305; 427/306; 427/97
[58] Field of Search .............................. 427/304–306, 427/98, 97

[56] References Cited

U.S. PATENT DOCUMENTS

| | | |
|---|---|---|
| 3,011,920 | 12/1961 | Shipley . |
| 3,513,015 | 5/1970 | Fitzpatrick . |
| 3,533,828 | 10/1970 | Rowe ................................ 427/306 |
| 3,562,038 | 2/1971 | Shipley ............................ 427/304 |
| 3,632,435 | 1/1972 | Eriksson . |
| 4,448,811 | 5/1984 | Doty ................................ 427/304 |

OTHER PUBLICATIONS

Cohen et al, "The Chemistry of Palladium–Tin Colloid Sensitizing Process", Journal of Colloid and Interface Science, vol. 55, No. 1, Apr. 1976, pp. 156-162.

*Primary Examiner*—John D. Smith
*Attorney, Agent, or Firm*—St. Onge Steward Johnston & Reens

[57] ABSTRACT

A method of electroless deposition of metal on a nonconductive substrate is disclosed and comprises treating a substrate prior to electroless deposition with a catalyst composition containing a mixed tin-palladium catalyst. An improvement in metal deposition is obtained by contacting the treated substrate with an alkaline accelerator bath containing an agent which oxidizes the tin.

14 Claims, No Drawings

OXIDIZING ACCELERATOR

The present application is a continuation-in-part of our previous application Ser. No. 510,333, filed July 1, 1983, and now abandoned.

BACKGROUND OF THE INVENTION

1. Field of the Invention

The present invention relates to improving electroless deposition on a non-conductive substrate by increasing the catalytic activity of the catalyst on the substrate prior to electroless plating. More particularly, the present invention relates to an improvement in a method of electroless plating wherein a non-conductive substrate is treated with a catalyst and the catalyst treated substrate is then contacted with an accelerator bath which increases the catalytic activity of the catalyzed substrate.

The method of the present invention is applicable in functional applications where metal deposited on a non-conductive substrate renders the substrate thermally conductive, electrically conductive, stronger, or more rigid, or a combination of these properties. The method of the present invention may also be used in decorative applications where the substrate is plated with a metal deposit to provide a pleasing finish.

2. Description of the Prior Art

Metals are deposited on non-conductive substrates by electroless plating techniques by first rendering the surface of the non-conductive substrate catalytic toward electroless metal deposition. One type of substrate for which electroless plating techniques are used is printed circuit boards having a copper-clad epoxy glass structure with drilled through-holes. A conductive copper layer is deposited on the through-holes to electrically connect adjacent copper layers. In prior art methods, substrates are cleaned, etched or made wettable, and then treated with a solution containing catalyst. The commercially predominant electroless systems typically deposit copper or nickel wherein the metal plating baths commonly contain reducing agents, usually formaldehyde in alkaline solution for copper plating, and more recently, hypophosphite reduced baths for copper plating, and hypophosphite reduction for nickel metal. When catalyzed non-conductive substrates are immersed or brought in contact with the electroless metal baths, a metal film will result on the substrate.

Widely accepted catalyst solutions are the tin-palladium colloids such as described in U.S. Pat. No. 3,011,920 and U.S. Pat. No. 3,532,518. They are composed of acidic solutions of tin-palladium which are made colloidal upon aging and/or heating, or by other known suitable methods. In these tin-palladium activator sols, the palladium is the catalytically active material, and the tin acts as a protective colloid, stabilizing the bath. When the non-conductors are immersed in these tin-palladium colloid activator baths, the active catalyst absorbs or adheres to the non-conductive substrate.

However, the presence of the protective tin can cause problems in the electroless metal deposition step, such as lengthy metal deposition times, blistering of deposited metal to substrate and contamination of the bath with tin. Therefore, an acceleration step is added between the activation step and electroless metal deposition. The prior art accelerator bath comprises a solvent for the protective metal, being substantially a non-solvent for the catalytic metal. The result of immersion of the substrate in the accelerator bath is exposure of the catalytic surface for electroless deposition. The accelerator step is followed by water rinsing to avoid or reduce contamination of the plating bath with accelerator solution.

The "accelerator" solution used to "accelerate" the catalyzed non-conductor as described in U.S. Pat. No. 3,011,920 is an acidic or alkaline solution which is thought to act as "a solvent to remove the protective colloid and/or the deflocculating agent from the colloidal particles of catalytic metal on the substrate surface". This patent further discloses that oxidation of the treated surface should be avoided. As described in U.S. Pat. No. 3,011,920 the "accelerator" step may sometimes be omitted when using an electroless bath solution that will itself be effective to remove the stabilizing material (such as an alkaline electroless copper bath using formaldehyde reducing agent.)

U.S. Pat. No. 4,448,811 discloses the use of acidic solutions preferably having a pH less than about 1 for use as accelerating solutions. It is stated that oxidizing agents such as chromic acid in conventional acidic accelerators make such accelerators sufficiently more aggressive to assure the removal of activating species which have been absorbed on stop-off painted areas and/or plating racks. It is believed that such highly acidic solutions are too aggressive for use on copper-clad printed circuit boards inasmuch as some of the copper may be dissolved. Similarly, U.S. Pat. No. 3,533,828 discloses use of acidic accelerator solutions containing perchloric acid or paladium chloride. U.S. Pat. No. 3,562,038 also discloses treatment with acidic stripper solution such as a hydrochloric acid and sodium perborate water solution.

In certain hypophosphite reduced nickel baths, and in some more recently developed hypophosphite reduced copper baths as described in U.S. Pat. Nos. 4,209,331 and 4,279,948, insufficient coverage of electroless metal on catalyzed substrates may occur if the accelerator step is omitted. Using the standard prior art acid or alkaline accelerators with these hypophosphite baths produced coverage but problems with slow rates of metal deposition were encountered. In general it can be said that when using the commercially proven, well stabilized electroless solutions, one finds the proper "acceleration" of the substrate to be a necessary step to insure complete coverage of metal on the catalyzed surface. However, problems can be encountered with the acceleration step itself. So-called "over-acceleration" which is thought to be excessive removal of catalytic metal from the substrate, can cause skip plating or "voiding" of the electroless metal film. Since inherent surface conditions of the various non-conductor substrates cause varying amounts of catalyst adsorption over the surface of a given part, one area of the part can be over accelerated (that is, too much catalyst is removed), thus causing skip plating, whereas another area of the same part which has a more adequate catalyst adsorption due to more favorable surface topography could be properly accelerated and acceptably plated. Thus for the variety of parts plated commercially, one will inevitably obtain varying degrees of catalyst adsorption, thus narrowing and complicating the accelerator solution parameters that must be maintained to insure that, over a given part, areas low in catalyst density not get over accelerated, while avoiding the problem that more effectively catalyzed areas of the part be "under accelerated." With conventional acceleration baths, rinses following the acceleration step may become contaminated, or the electroless plating bath may become contaminated by stannous tin and operate outside desired optimum parameters. In production situations, such instances are common rather than exceptional.

It is the object of this present invention to provide improved accelerator compositions for use in a method of electroless plating that will produce a superior catalytic surface on a non-conductive substrate which is to be electrolessly plated. Another object of this invention is to provide more complete and rapid coverage on non-conductive substrates in the electroless plating bath. Still another object of the invention is to eliminate or reduce contamination of rinses and the plating bath with stannous tin ($Sn^{+2}$). A further object is to reduce or eliminate acidic disolution of copper layers of a copper-clad printed circuit board during the acceleration step.

SUMMARY OF THE INVENTION

In accordance with an embodiment of the present invention, it has been discovered that in a method of electroless deposition of metal on a substrate, which method comprises treating the substrate prior to electroless deposition with a catalyst composition containing tin-palladium colloids, an improvement is obtained by contacting the treated substrate with an alkaline accelerator bath containing an agent which reacts with the protective stannous tin and activates the palladium catalyst, and preferably an agent which oxidizes the protective tin.

A particularly preferred catalyst solution for use in the electroless deposition of copper is disclosed in U.S. Pat. No. 3,532,518, which discloses a tin-palladium solution. In the instance where a tin-palladium catalyst solution is used, in a method in accordance with the present invention, the accelerator bath contains an oxidizing agent for the tin. Although it has been found that an aqueous alkaline bath comprising sodium chlorite is an excellent accelerator bath for a tin-palladium catalyst solution, other agents which oxidize tin may be used in the bath, and such agents include, for example, sodium dichloroisocyanurate, hydrogen peroxide, a sodium hypochlorite, sodium chlorate, potassium permanganate, sodium perborate and compatible mixtures thereof.

In a method wherein copper is to be electrolessly deposited, the hypophosphite reduced copper baths and method disclosed in U.S. Pat. Nos. 4,209,331 and 4,279,948 can be used. Other commercially available electroless deposition baths may be used. For example, for the deposition of copper, conventional formaldehyde reduced copper baths may be used. It has also been determined that electroless nickel baths may be used with a tin-palladium catalyst solution and an accelerator bath in accordance with the present invention.

The type of substrate upon which metal is to be deposited will vary depending upon the desired end use. For example, often it is desired to manufacture a printed circuit board by the deposition of copper on a non-conductive/conductive laminate. The use of an alkaline accelerator bath is particularly preferred because the alkaline solution does not dissolve the conductive copper panels during acceleration. Also, it is known to deposit metal on a plastic substrate.

It is believed that the oxidizing accelerator of the present invention oxidizes (stannous) $Sn^{+2}$ to (stannic) $Sn^{+4}$ with the possible hydrolysis of a $Sn^{+4}$ compound which renders the adsorbed palladium catalyst material more catalytically active towards the electroless metal reduction mechanism providing increased plating rates. The $Sn^{+4}$ is also believed to be less harmful to the plating bath and rinses than $Sn^{+2}$. Thus, any oxidized tin carried into the plating bath will have less effect on the plating bath than $Sn^{+2}$, and the plating bath will last longer and plate better over its life.

DETAILED DESCRIPTION OF THE PREFERRED EMBODIMENT

The preferred embodiment of this invention comprises the use of copper-clad laminates with thru-holes as substrates to be electrolessly plated although plastics and other non-conductive substrates can be used. The substrates are first cleaned with suitable cleaners known to the art, followed by appropriate rinses. These cleaners can also contain "conditioning" agents which promote the adhesion of catalytic material to the substrate. The substrate is then usually etched with a chemical etchant, several of which are commercially available for this purpose, in order to prepare the copper portion of the surface for reception of the activator and subsequent electroless plating. Acid dips, neutralizers, and water rinses may be included before and after etching if applicable. The substrate is then contacted with an activator which is a standard proprietary catalyzing agent such as the tin-palladium sol described in U.S. Pat. No. 3,532,518.

The treated substrate, after the catalyst solution has been applied thereto, is rinsed and then contacted with an accelerator bath in accordance with the present invention. The accelerator bath contains one or more oxidizing agents in a sufficiently quantity for the oxidizing agent to oxidize the tin and increase the catalytic activity of the palladium. For the previously described tin-palladium catalyst solution, it has been found that the preferred oxidizing agent is sodium chlorite, although other oxidizing agents such as sodium dichloroisocyanurate, hydrogen peroxide, sodium hypochlorite, sodium chlorate, potassium permanganate, and mixtures of these oxidizing agents can be used.

Although the concentration of the oxidizing agent in the accelerator bath will vary depending upon variables such as the temperature and time of application of contact in the accelerator bath, it is believed a concentration of oxidizing agent in the accelerator bath should be sufficient to oxidize the protective stannous ions on the substrate. Preferably, the accelerator bath contains from about 1 gram per liter of oxidizing agent to saturation. The accelerator bath may include additional components, such as a buffer, to adjust the pH of the accelerator bath to an alkaline pH. The buffer selected should be compatible with the oxidizing agent used, and it has been found that when sodium chlorite is used as the oxidizing agent, sodium bicarbonate is a suitable buffer.

One particularly preferred accelerator bath of this invention comprises 5 g./l. sodium chlorite and 10 g./l. sodium bicarbonate. The pH is adjusted to 8.3 with acid or base on make-up if necessary. The substrates are subjected to the bath for 5 minutes at a temperature of 140° F. Temperatures of the bath may vary from about room temperature to about 140° F. Higher temperatures can be used. However, no improvement is believed to be gained at temperatures over 140° F. Preferably time in the accelerator bath ranges from about 2 to 6 minutes. These times are typically used for production purposes. However, these times may vary out of this range depending on the temperature and concentration of the bath. The time used is actually the time necessary to provide the best metal coverage and rates of metal deposition within these variables of temperature and concentrations.

The accelerator bath should have a pH in the alkaline range, that is, above about a pH of 7. It is preferred that the pH be maintained in the range above about 7 to about 10, and, most preferrably between about 8 and about 9.

Once the substrate has been treated with the accelerator bath, the substrate is then rinsed with water and subjected to an electroless deposition bath. In the instance where it is desired to plate the substrate with copper, a hypophosphite reduced copper bath and method as disclosed in U.S. Pat. Nos. 4,209,331 and 4,279,948 may be used.

The advantages of a method in accordance with the present invention in which an accelerator bath including an oxidizing agent are shown in the following examples:

EXAMPLE 1

Epoxy glass laminate panels (FR-4) which are commercially available are used as the substrate. This epoxy glass is commonly used for printed circuit boards which are typically copper-clad with drilled through-holes. These panels are also used to check the amount of metal deposited in a time period in an electroless deposition bath, in this example, a hypophosphite reduced copper bath. The rate of deposition is expressed in microinches of copper for the time period used. These panels are first stripped of the copper-cladding foil, rinsed, dried and weighed and then catalyzed by the "one-step" method using a commercially available mixed palladium-tin catalyst as disclosed in U.S. Pat. No. 3,532,518, along with its method of use. This commercially available solution is sold by MacDermid Incorporated under the designation Mactivate 10 and contains hydrochloric acid, palladium metal and stannous ion from stannous salts.

The panels are rinsed and contacted with the accelerator bath of this invention comprising 5 g./l. sodium chlorite and 10 g./l. sodium bicarbonate in water for 5 minutes at 140° F. The pH of the bath is 8.3 as adjusted with hydrochloric acid at start-up.

The substrate is then rinsed and electrolessly plated in a hypophosphite reduced copper bath as disclosed in U.S. Pat. Nos. 4,209,331 and 4,279,948 along with its method of use for 6 minutes. The plating bath had the following composition:

$CuCl_2 \cdot 2H_2O$ 0.06M (10 g/l)
N-hydroxyethyl ethylenediamine triacetic acid (0.074M (26 g/l)
$NaH_2PO_2 \cdot H_2O$ 0.34M (26 g/l)
Water
pH adjuster as needed for pH 9 (HCl or $N_aOH$)
Bath Temperature: 140°–150° F.

The panels were removed from the bath and examined and copper coverage was found to be good. The panels were weighed, stripped of deposited copper and weighed again. The rate of copper deposited was determined to be 20.1 microinches in 6 minutes deposition time.

EXAMPLES 2–9

FR-4 epoxy glass rate panels are subjected to the procedure of Example 1. Varying concentrations of sodium chlorite are used. The results are shown in Table A.

TABLE A

| | Accelerator | | | | | Electroless Deposition | |
|---|---|---|---|---|---|---|---|
| Example No. | $NaClO_2$ g./l. | $NaHCO_3$ g./l. | pH | Temp. °F. | Time in Accelerator (Min.) | Plating Time (Min.) | Deposition Thickness Microinches Cu |
| 2 | 1.0 | 10 | 8.3 | 140 | 5 | 6 | 16.80 |
| 3 | 5.0 | 10 | 9 | 140 | 2 | 6 | 20.50 |
| 4 | 20.0 | 10 | 8.5 | 140 | 5 | 6 | 16.42 |
| 5 | 25.0 | 10 | 8.6 | 140 | 5 | 6 | 15.70 |
| 6 | 26.5 | 10 | 9.5 | 140 | 5 | 6 | 18.00 |
| 7 | 53.0 | 10 | 8.8 | 140 | 5 | 6 | 15.70 |
| 8 | 5.0 | 10 | 8.3 | 140 | 5 | 10 | 34.00 |
| 9 | 0.0 | 10 | 8.5 | 140 | 5 | 6 | 10.40 |

Example 2–8 substrates had good copper coverage and good pink color after electroless deposition. Example 9 with $NaHCO_3$ and no $NaClO_2$ provides much slower plating rates than Examples 2–8.

EXAMPLE 10

Panels of ABS plastic were subjected to a chromic acid etchant followed by a neutralizer and water rinse. This treatment is typical for preparation of ABS plastic prior activation for reception of electroless plating. The panels were then subjected to the activator and accelerator according to the procedure of Example 1. Good copper coverage and color are seen after electroless deposition along with favorable plating rates.

EXAMPLE 11

The procedure of Example 1 is followed except that the accelerator bath contained 5 g./l. of potassium dichloroisocyanurate as the oxidizer and 10 g./l. of $NaHCO_3$ as a buffer. The pH was 8.5 and the panels were treated with the accelerator bath for 5 minutes at 140° F. The panels were then rinsed and immersed in the hypophosphite reduced electroless copper bath for 6 minutes. The rate was 17.8 microinches of copper in 6 minutes plating time. Copper coverage and color were good.

EXAMPLES 12–15

Accelerator baths are prepared containing a variety of oxidizers. The procedure of Example 1 is followed with the following concentrations of oxidizers:
Example 12: sodium chlorate 25 g./l.
Example 13: potassium permanganate 1 g./l.

Example 14: sodium perborate 5 g./l.
Example 15: sodium hypochlorite 5 g./l.
Example 15 also contains 10 g./l. NaHCO$_3$ to maintain the pH in an alkaline range.

The panels all showed good copper coverage, color and rates of copper deposition.

EXAMPLE 16

The procedure of Example 1 is followed except that after acceleration and rinsing, the panels were immersed in a commercially available formaldehyde reduced electroless copper bath sold by MacDermaid Incorporated under the designatin MACu Dep 20 containing copper salts, formaldehyde, sodium hydroxide and complexers.

Good copper coverage and plating rates were obtained with this copper bath and the accelerator bath of this invention.

EXAMPLE 17

ABS plastic panels are subjected to a typical ABS electroless deposition system using the "one-step" activator of Example 1, rinsed, and subjected to the accelerator of this invention according to the procedure of Example 1. The panels were rinsed and immersed in a commercially available hypophosphite reduced electroless nickel bath sold by MacDermaid Incorporated under the designation MACuplex 9340. The bath contained the following components: Nickel salts, hypophosphite, buffering agents, stabilizers and complexers.

Good nickel coverage and plating rates were obtained with this nickel bath, plastic substrates and the accelerator bath of this invention.

COMPARATIVE EXAMPLE A

FR-4 epoxy glass laminate panels were subjected to the procedure of Example 1 except that a known prior art aqueous sulfuric acid accelerator such as that disclosed in U.S. Pat. No. 3,011,920, containing 56% by weight of H$_2$SO$_4$ was used instead of the accelerator of this invention. Electroless deposition time was again 6 minutes. 12.2 microinches of copper was deposited in 6 minutes. However, the plated panels were darker and transparent in some areas when compared to those of Example 1, showing insufficient and uneven metal coverage.

COMPARATIVE EXAMPLE B

The procedure of Example 1 is followed except that an accelerator bath containing a reducing agent, 1% hydrazine in water, was used instead of the accelerator bath of this invention. A reducing agent was used to test the concept that it is the oxidizer of this invention that provides improved acceleration and therefore better results in the electroless deposition bath. After electroless copper plating, the panels were examined and found to be dark green in color with no effective copper coverage. A reducing agent actually provides worse results than the prior art acceleration bath, having the opposite effect of the oxidizing accelerator of this invention.

COMPARATIVE EXAMPLE C

FR-4 epoxy glass laminate panels are subjected to the procedure of Example 1 except that an accelerator bath in accordance with U.S. Pat. No. 3,011,920 containing 0.5 Molar (50 ml./l.) HClO$_4$ was used instead of the accelerator of this invention. 11.8 microinches of copper was deposited in 6 minutes electroless deposition time. The panels were darker, had insufficient metal coverage and showed blistering in comparison to those of Example 1.

The preceding examples show that the oxidizing accelerator of this invention provides a better catalytic surface on the substrate to be plated than the prior art accelerator bath or the accelerator bath containing a reducing agent and therefore, improved plating rates on electroless deposition for a variety of substrates and electroless deposition baths and methods.

It should be understood that although specific embodiments of the invention have been described herein in detail, such description is for purposes of illustration only and modifications may be made thereto by those skilled in the art within the scope of the invention.

We claim:

1. In a method of electroless deposition of metal on a substrate surface, wherein the substrate surface is treated in a one-step catalyst activation process with a sol composition formed from palladium and tin compounds to deposit on said surface metal comprised of palladium, catalytically active to the electroless deposition of metal, protected by compounds comprised of stannous tin compounds; followed by treatment of said surface with an accelerator to eliminate the protective effect of said compounds comprised of stannous tin compounds; and then followed by immersion of said activated and accelerated substrate in an electroless metal depositing solution; the improvement comprising contacting said activated substrate with an accelerator comprised of an alkaline solution containing an oxidizing agent capable of oxidizing stannous tin to stannic tin, the amount of said oxidizing agent in said solution being sufficient to eliminate the protective effect of said compounds comprised of stannous tin compounds and increase the catalytic activity to electroless metal deposition of said deposited metal comprised of palladium on said substrate surface.

2. The method according to claim 1 wherein said alkaline solution contains at least about 1 gram per liter of said oxidizing agent.

3. The method according to claim 1 wherein the pH of said alkaline solution is between about 7 and 10.

4. The method according to claim 3 wherein the pH of said alkaline solution is between about 8 and 9.

5. The method according to claims 1 or 2 wherein said oxidizing agent is selected from the group consisting of sodium chlorite, sodium dichloroisocyanurate, sodium hypochlorite, sodium chlorate, potassium permanganate, sodium perborate and combinations thereof.

6. In a method of electroless deposition of metal on a substrate surface, wherein the substrate surface is treated in a one-step catalyst activation process with a sol composition formed from palladium and tin compounds to deposit on said surface metal comprised of palladium, catalytically active to the electroless deposition of metal, protected by compounds comprised of stannous tin compounds; followed by treatment of said surface with an accelerator to eliminate the protective effect of said compounds comprised of stannous tin compounds; and then followed by immersion of said activated and accelerated substrate in an electroless metal depositing solution; the improvement comprising contacting said activated substrate with an accelerator comprised of an alkaline solution containing an oxidizing agent capable of oxidizing stannous tin to stannic tin, the amount of said oxidizing agent in said solution being at least about one gram per liter and sufficient to eliminate the protective effect of said compounds comprised of stannous tin compounds and increase the catalytic activity to electroless metal deposition of said deposited metal comprised of palladium on said substrate surface.

7. The method according to claim 6 wherein the pH of said alkaline solution is from about 8 to 10.

8. In a method of electroless deposition of metal on a substrate surface, wherein the substrate surface is treated in a one-step catalyst activation process with a sol composition formed from palladium and tin compounds to deposit on said surface metal comprised of palladium, catalytically active to the electroless deposition of metal, protected by compounds comprised of stannous tin compounds; followed by treatment of said surface with an accelerator to eliminate the protective effect of said compounds comprised of stannous tin compounds; and then followed by immersion of said activated and accelerated substrate in an electroless metal depositing solution; the improvement comprising contacting said activated substrate with an accelerator comprised of an alkaline solution containing at least about 1 gram per liter of an agent selected from the group consisting of sodium chlorite, sodium dichloroisocyanurate, sodium hypochlorite, sodium chlorate, potassium permanganate, sodium perborate and combinations thereof to increase the catalytic activity to electroless metal deposition of said deposited metal comprised of palladium on said substrate surface.

9. The method according to claim 8 wherein the pH of said alkaline solution is from about 7 to 10.

10. In a method of electroless deposition of metal on a copper-clad printed circuit board substrate surface, wherein the substrate surface is treated in a one-step catalyst activation process with a sol composition formed from palladium and tin compounds to deposit on said surface metal comprised of palladium, catalytically active to the electroless deposition of metal, protected by compounds comprised of stannous tin compounds; followed by treatment of said surface with an accelerator to eliminate the protective effect of said compounds comprised of stannous tin compounds; and then followed by immersion of said activated and accelerated substrate in an electroless metal depositing solution; the improvement comprising contacting said activated substrate with an accelerator comprised of an alkaline solution containing an oxidizing agent capable of oxidizing stannous tin to stannic tin, the amount of said oxidizing agent in said solution being sufficient to eliminate the protective effect of said compounds comprised of stannous tin compounds and increase the catalytic activity to electroless metal deposition of said deposited metal comprised of palladium on said substrate surface.

11. The method according to claim 10 wherein said alkaline solution contains at least about 1 gram per liter of said oxidizing agent.

12. The method according to claim 10 wherein the pH of said alkaline solution is between about 7 and 10.

13. The method according to claim 12 werein the pH of said alkaline solution is between about 8 and 9.

14. The method according to claims 10 or 11 wherein said oxidizing agent is selected from the group consisting of sodium chlorite, sodium dichloroisocyanurate, sodium hypochlorite, sodium chlorate, potassium permanganate, sodium perborate and combinations thereof.

* * * * *